United States Patent
Flynn et al.

(10) Patent No.: US 7,154,317 B2
(45) Date of Patent: Dec. 26, 2006

(54) LATCH CIRCUIT INCLUDING A DATA RETENTION LATCH

(75) Inventors: David Walter Flynn, Cambridge (GB); David William Howard, Cambridge (GB)

(73) Assignee: ARM Limited, Cambridge (GB)

( * ) Notice: Subject to any disclaimer, the term of this patent is extended or adjusted under 35 U.S.C. 154(b) by 12 days.

(21) Appl. No.: 11/032,225

(22) Filed: Jan. 11, 2005

(65) Prior Publication Data
US 2006/0152268 A1    Jul. 13, 2006

(51) Int. Cl.
*H03K 3/289* (2006.01)
(52) U.S. Cl. .................................... 327/202
(58) Field of Classification Search ........ 327/199–203, 327/210–212, 215, 218–219
See application file for complete search history.

(56) References Cited

U.S. PATENT DOCUMENTS 5,939,915 A * 8/1999 Curran ....................... 327/202
6,380,780 B1 * 4/2002 Aitken et al. ................ 327/202
6,437,623 B1 * 8/2002 Hsu et al. .................... 327/202
6,680,622 B1 * 1/2004 Zounes ......................... 326/16

OTHER PUBLICATIONS

V. Zyuban et al, "Low Power Integrated Scan-Retention Mechanism" *ISLPED '02*, Aug. 2002, pp. 98-102.

* cited by examiner

*Primary Examiner*—My-Trang Nu Ton
(74) *Attorney, Agent, or Firm*—Nixon & Vanderhye P.C

(57) ABSTRACT

A latch circuit 2 is described including a function path latch 4, 6, which may be in the form of a standard flip-flop, together with a data retention latch 12, 14. The reset signal nreset and the scan enable signal SE are used to control these latches to perform reset, scan, save and restore functions. The save and restore functions serve to save a data value dv from the functional path latch 4, 6 into the data retention latch 12, 14 and restore this value such that the functional path latch can be powered down without a loss of data.

11 Claims, 3 Drawing Sheets

| (Asynchronous nReset) | SE | Operation of this DFF |
|---|---|---|
| 0 | 0 | Restore state from StateSaver latch |
| 0 | ⎍ | Reset DFF; Q->0 |
| | 1 | Power-on-Reset condition (global initialize) |
| 1 | 0 | Quiescent - normal DFF operation when Clk rises |
| 1 | ⎍ | Save current state into StateSaver latch |
| | 1 | Normal scan mode when clocked (also updates state) |

LATCH CIRCUIT INCLUDING A DATA RETENTION LATCH

BACKGROUND OF THE INVENTION

1. Field of the Invention

This invention relates to the field of latch circuits. More particularly, this invention relates to latch circuits including a data retention latch.

2. Description of the Prior Art

Static leakage currents are becoming a significant factor in the total power consumption of CMOS process devices with sizes less than 100 nanometers. Accordingly, techniques to reduce leakage current are becoming more significant. One way to stop leakage currents is to switch off the power supply to the circuit when the circuit is idle. Another method of leakage current reduction is to disconnect the CMOS logic gates from the power supply when the system is idle, using high-threshold PMOS "Header" transistors or high-threshold NMOS "footer" transistors placed between the logic gates and the Vdd and Vss power supplies. This technique is usually referred to as multi-threshold CMOS (MTCMOS).

Whilst the above techniques do reduce the power consumption due to leakage currents when the circuit is idle, they suffer from the disadvantage that whether the power supply is switched off or isolated from the circuit, the stored logic state of sequential circuits (latches and flip-flops) is lost. There are latch circuit designs that maintain the stored state when most of their circuitry is powered down by including a small number of devices which are powered from a separate permanently enabled power supply. Such devices are sometimes referred to as "retention flops". One known type of retention flop has an additional latch, separate from the usual master and slave latches, that maintains the stored state when the rest of the circuit is powered down. This type of latching circuit is sometimes called a "balloon flop" and the additional data retaining latch is known as a "balloon latch".

Whilst retention latches have advantages in reducing static leakage current and avoiding a loss of state such that processing can be rapidly resumed, they do suffer from disadvantages in themselves. Control signals need to be provided to control the saving of state into the balloon (data retention) latch and to restore that saved state back into the main latch. These control signals must be widely distributed throughout the system concerned since a comparatively high number of latches are typically present and these need to be supplied with the appropriate save and restore control signals. The additional circuit layout, area, power consumption and other overhead associated with these high fan out save and restore control signals is a significant disadvantage.

SUMMARY OF THE INVENTION

Viewed from one aspect the present invention provides a latch circuit having a data signal input, a scan signal input, a clock signal input, a reset signal input, a scan enable signal input and a data signal output, said latch circuit comprising:

a functional path latch having an active mode in which said functional path latch is operable in response to a clock signal received at said clock signal input to store a data signal value received at said data signal input and to output said data signal value at said data signal output and an inactive mode in which said functional path latch is not able to store said data signal value; and a data retention latch operable to save said data signal value from said functional path latch when said functional path latch enters said inactive mode and to restore said data signal value to said functional path latch when said functional path latch enters said active mode; wherein a reset signal received at said reset signal input and a scan enable signal received at said scan enable signal input control said functional path latch and said data retention latch:

(i) to reset at least said functional path latch;

(ii) to restore a data signal value stored in said data retention latch to said functional path latch;

(iii) to select a scan signal input value received at said scan signal input for storage in at least one of said functional path latch and said data retention latch; and (iv) to save a data signal value from said functional path latch to said data retention latch.

The present technique recognises that latch circuits are typically already provided with reset signals and scan enable signals. The reset signals are provided to ensure appropriate reset behaviour, such as power-on reset behaviour, so that the system will start from a predefined known condition when desired. The reset signal forces the latch to a known state, whether that be a zero or a one, both possibilities being encompassed herein. Scan enabled signals are typically provided for latches within many integrated circuit designs to enable debug and diagnostic operations to be performed whereby latched signal values can be captured into serial scan chains and recovered from the integrated circuit. It is also possible to insert signal values into latches via the serial scan chains for diagnostic purposes. The reset signal and scan enable signal are typically already provided to a majority of the latches within an integrated circuit and the present technique re-uses these two signals to additionally provide the save and restore control functions required in connection with a data retention latch within the latching circuit as a whole. The technique recognises an orthogonality and redundancy in the existing uses of the reset and scan enable signals and exploits this to use these two signals in combination to additionally encode and carry the save and restore control to the latching circuit. Whilst the control of the functionality of the data retention latch via the reset signal and the scan enable signal could have utility in a variety of different situations, it is particularly useful in circumstances where the functional path latch and the data retention latch are connected to separate power supply domains. Such arrangements allow a power supply domain of the functional path latch to be powered down when it is inactive with the power supply domain of the data retention latch remaining powered such that the data signal value therein can be maintained during the inactive mode of the functional path latch.

The power saving capabilities of the latch circuit are further enhanced if the data retention latch is formed of gates having a threshold voltage associated with a lower level of static leakage current and a slower switching time compared to the gates of the functional path latch. The functional path latch is typically more likely to be on a critical path within the integrated circuit required to achieve a desired level of processing performance and accordingly the use of fast, but leaky gates is desirable whereas the data retention latch is not so speed critical and accordingly slower but more power efficient gates can be used in its construction.

The data retention latch can serve an additional function which helps to reduce power consumption and increase speed if it is used to drive a scan data output signal separately from the normal data output signal. This unloads the normal data output signal from a need to have to drive any connections or circuitry associated with scan output during the normal operational (functional) mode of the integrated circuit.

The ability of the data retention latch to store a data signal value may additionally be used if desired to restore that data signal value multiple times to the functional path latch. This can be useful in diagnostic operations when it is desired to restart the circuit from a particular known state on multiple occasions during the investigation of a particular fault or scenario.

It will be appreciated that not all of the latches within an integrated circuit need be provided with the data retention functionality. Some latches may have no architectural significance and the saving of temporary state within such latches during a low power mode is to no advantage. In such circumstances, the circuit overhead associated with providing data retention latches within such situations need not be carried. The use of the reset signal as part of the control of the restore function of the data retention latches where present has the advantage that the same change in the reset signal that is part of the restore signalling can be used to reset those latches which do not have the data retention capability thereby simplifying the control of the integrated circuit as a whole when such mixed types of latches are present.

Viewed from another aspect the present invention provides a latch circuit having a data signal input, a scan signal input, a clock signal input, a reset signal input, a scan enable signal input and a data signal output, said latch circuit comprising:

functional path latch means for, in an active mode, in response to a clock signal received at said clock signal input, storing a data signal value received at said data signal input and outputting said data signal value at said data signal output and, in an inactive mode, not storing said data signal value; and a data retention latch means for saving said data signal value from said functional path latch means when said functional path latch means enters said inactive mode and restoring said data signal value to said functional path latch means when said functional path latch means enters said active mode; wherein a reset signal received at said reset signal input and a scan enable signal received at said scan enable signal input control said functional path latch means and said data retention latch means:

(i) to reset at least said functional path latch means;

(ii) to restore a data signal value stored in said data retention latch means to said functional path latch means;

(iii) to select a scan signal input value received at said scan signal input for storage in at least one of said functional path latch means and said data retention latch means; and (iv) to save a data signal value from said functional path latch means to said data retention latch means.

Viewed from a further aspect the present invention provides a method of controlling a latch circuit having a data signal input, a scan signal input, a clock signal input, a reset signal input, a scan enable signal input and a data signal output, said latch circuit comprising:

a functional path latch having an active mode in which said functional path latch is operable in response to a clock signal received at said clock signal input to store a data signal value received at said data signal input and to output said data signal value at said data signal output and an inactive mode in which said functional path latch is not able to store said data signal value; and a data retention latch operable to save said data signal value from said functional path latch when said functional path latch enters said inactive mode and to restore said data signal value to said functional path latch when said functional path logic enters said active mode; said method comprising:

in response to a reset signal received at said reset signal input and a scan enable signal received at said scan enable signal input, controlling said functional path latch and said data retention latch:

(i) to reset at least said functional path latch;

(ii) to restore a data signal value stored in said data retention latch to said functional path latch;

(iii) to select a scan signal input value received at said scan signal input for storage in at least one of said functional path latch and said data retention latch; and (iv) to save a data signal value from said functional path latch to said data retention latch.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
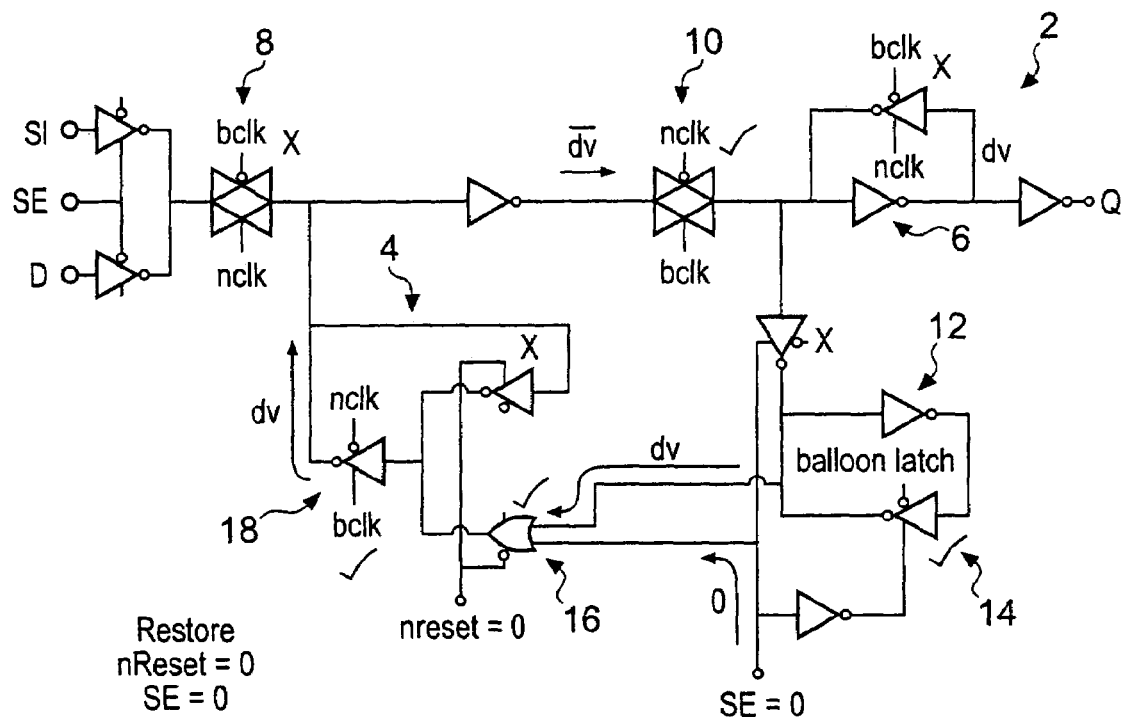
FIG. 1 schematically illustrates the operation of a latch circuit performing a restore operation.

FIG. 1 illustrates a latch circuit 2 which is typically found within a digital data processing apparatus. It will be appreciated that such an apparatus will typically have the form of an integrated circuit and will include many hundreds or thousands of latch circuits. This latch circuit includes a functional latch in the form of a flip-flop latch which has a master portion 4 and the slave portion 6 formed of respective inverters in a weak feedback arrangement with one of the inverters being gated by the clock signal. Transmission gates 8, 10 separate these latches within the flip-flop latch in the normal way. It will be appreciated that this functional path latch is in this example in the form of a flip-flop having master and slave latches 4, 6 but the present technique is also applicable to embodiments in which this functional path latch could take a different form e.g. it may include a single latching element.

As this functional path latch 4, 6, 8, 10 is on the main functional path through the latch circuit 2 which is used during normal functional (operational) mode processing it is formed of fast gates using a low threshold voltage. Such fast gates suffer to a greater extent from static leakage current but the increase in speed of operation is desirable.

A data retention latch (balloon latch) is formed by fed back inverters 12, 14. The data retention latch 12, 14 is formed of relatively slow high voltage threshold devices with a lower static leakage current than the devices on the functional path. The functional path latch devices are formed on a first power domain which may be selectively powered on and powered off corresponding to the functional path latch being in its active mode and its inactive mode. The data retention latch 12, 14 is on a separate power domain which is permanently powered irrespective of the mode of the functional path latch.

The latch circuit 2 has a data signal input D receiving a data signal value, a scan signal input SI receiving a scan signal value, a clock signal input bclk, nclk receiving a clock signal, a reset signal input nreset receiving a reset signal, a scan enable signal input SE receiving a scan enable signal and a data signal output Q generating a data signal output value.

FIG. 1 illustrates the restore operation. To force this restore operation the reset signal nreset is set low and the scan enable signal SE is also set low. The scan enable signal SE being low is supplied to one input of a NOR gate 16 such that the output of the NOR gate 16 is controlled by its other input. This other input is taken from the data retention latch 12, 14 and is the stored data value dv. This stored data value dv is thus output (in inverted form) from the NOR gate 16 and passed through an inverter 18 into the master latch portion 4 of the functional path latch 4, 6. It then passes into the slave portion 6 of the functional path latch 4, 6. The clock signals bclk, nclk for the latch circuit 2 are held such that the transmission gate 10 is transparent and the transmission gate 8 is non-transparent during this restore operation. This may be achieved by NORing the clock signal with the reset signal nreset to generate the clock signals which are applied to the transmission gates 8, 10 (namely bclk, nclk).

It will be appreciated that before the restore operation illustrated in FIG. 1 can be performed, the functional path latch must be returned to its active mode of operation with its power supply restored such that the stored data value fed to it from the data retention latch 12, 14 can be appropriately captured and securely held within the functional path latch.

Figure 2:
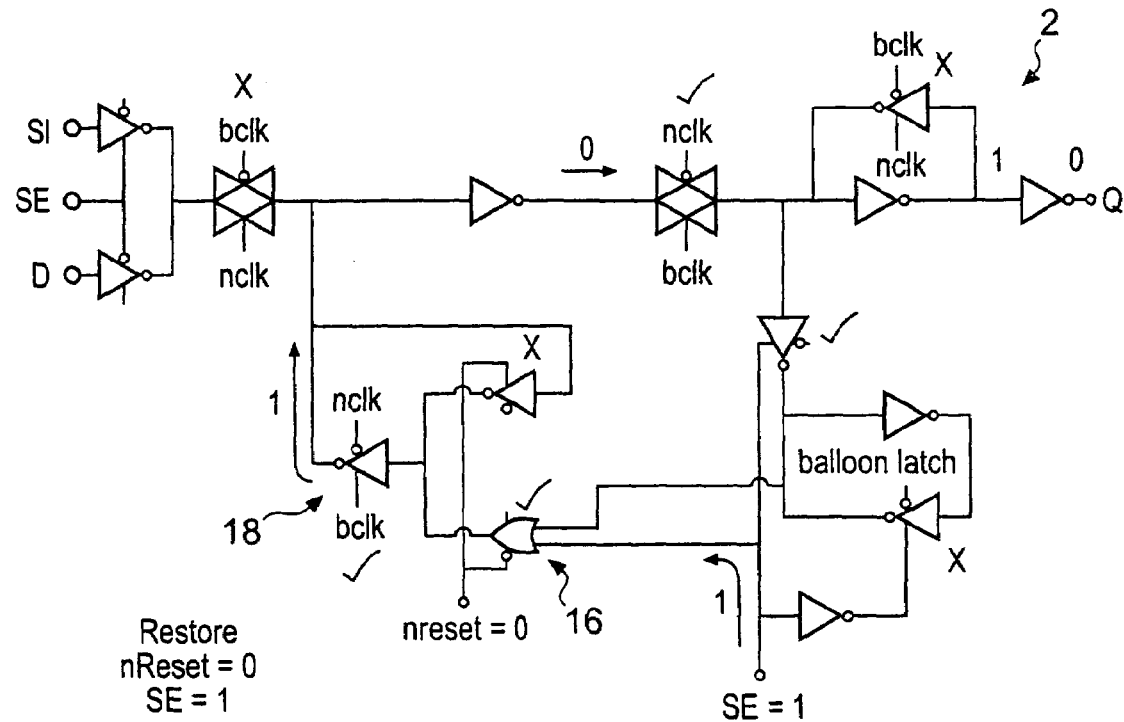
FIG. 2 schematically illustrates the operation of a latch circuit performing a reset operation.

FIG. 2 schematically illustrates the reset operation of the latch circuit 2. The difference compared to FIG. 1 is that the scan enable SE signal in this example is held high. This scan enable signal SE is supplied as one input to the NOR gate 16 and accordingly forces the output of this NOR gate 16 to be low irrespective of whatever value is being supplied to the other input of that NOR gate 16 from the data retention latch 12, 14. Accordingly, the output from the inverter 18 is forced to be high and this is fed as a reset value into the functional path latch through which it propagates to reach the data signal output Q. This final data output will be a zero corresponding to the latch circuit 2 being forced to a zero output by the reset.

Figure 3:
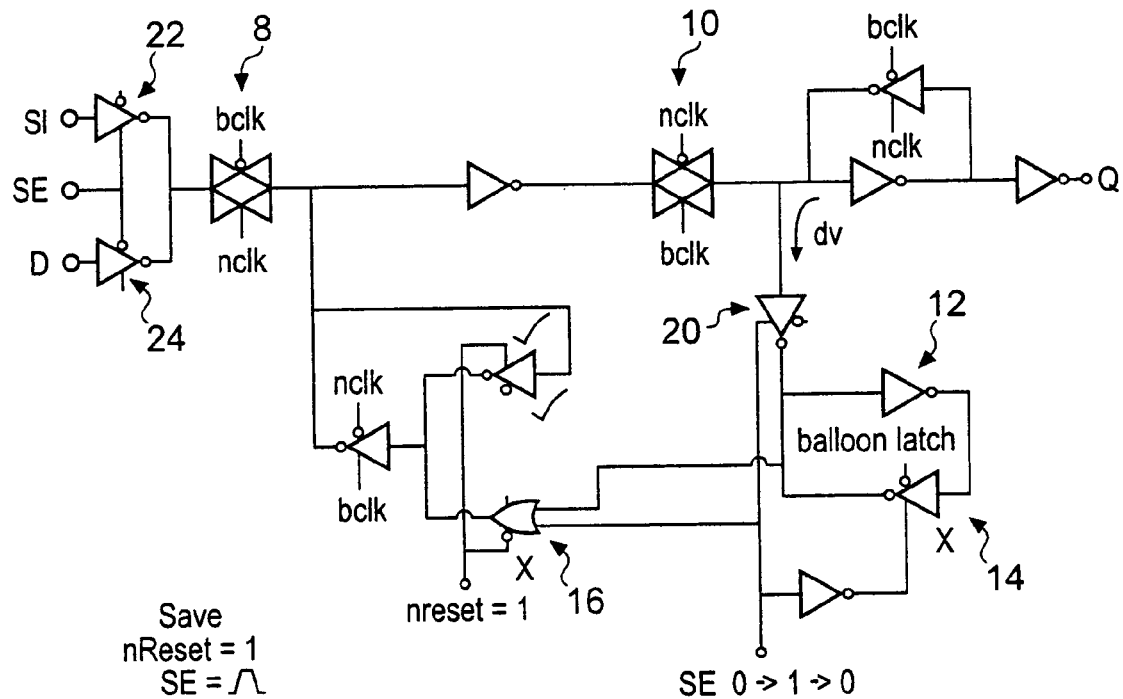
FIG. 3 schematically illustrates the operation of a latch circuit performing a save operation.

FIG. 3 illustrates the save operation. In the example of FIG. 3 the reset signal nreset is high and accordingly the NOR gate 16 is inactive. The feedback within the master portion 4 of the flip-flop is active depending upon the state of the clock at that time. In order to perform a save operation, the scan enable signal SE is pulsed to a high value. This temporarily opens the inverter 20 which serves to direct the data signal value dv currently held within the slave latch into the data retention latch 12, 14. The inverter 14 is held shut during this pulsing by the scan enable signal SE to avoid any conflict between the new data value dv being captured and any existing value within the data retention latch 12, 14. The transmission gate 8 remains closed during this pulsing of the scan enable signal SE such that the scan signal input SI does not feed a scan signal input value into the functional path latch. The inverters 22, 24 serve as a multiplexer which selects between a scan signal value input SI and a data signal input D depending upon the value of the scan enable signal SE.

Figure 4:
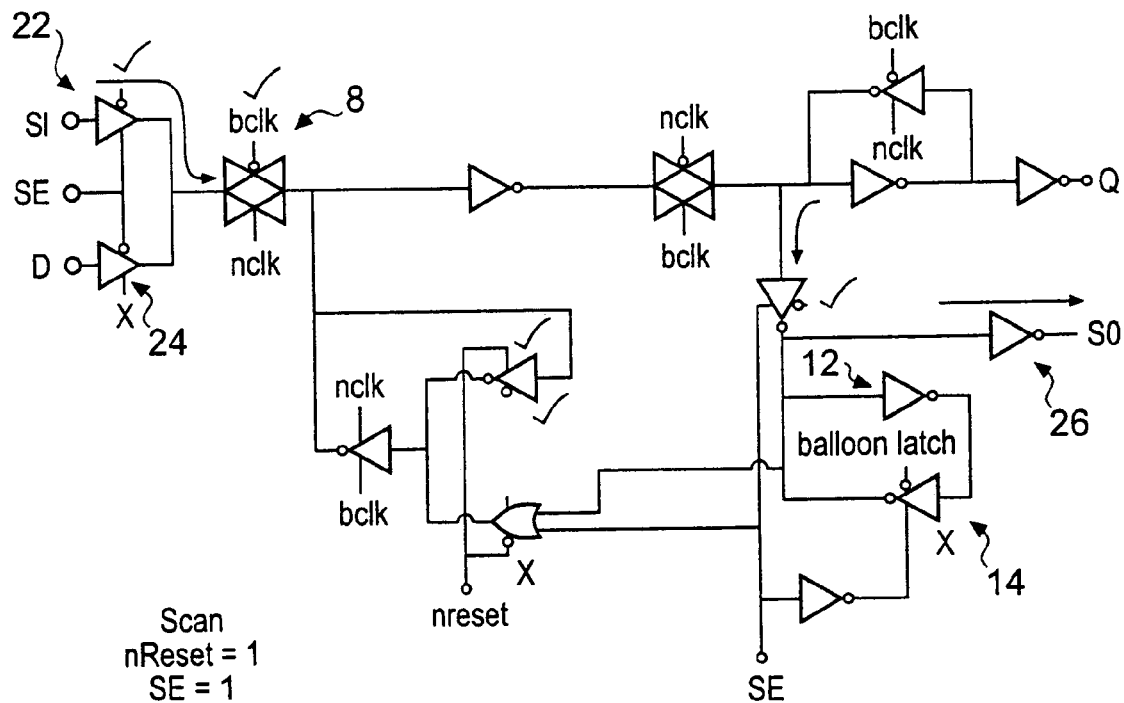
FIG. 4 schematically illustrates the operation of a latch circuit performing a scan operation.

FIG. 4 illustrates the scan mode of operation. In this mode the reset signal nreset is again held high and the scan enable signal SE is held high. The scan enable signal SE being held high serves to switch the multiplexer 22, 24 to select the scan signal input SI which is passed through the transmission gate 8 into the functional path latch 4, 6. The data retention latch 12, 14 also serves to capture the scan output data value which is fed via a buffer circuit (in the form of an inverter 26) to a scan data output SO (illustrated in FIG. 4 only). This scan data output is separate from the normal data output Q of the functional path latch 4, 6 thereby reducing the load on the normal data output Q.

Figures 5, 6:
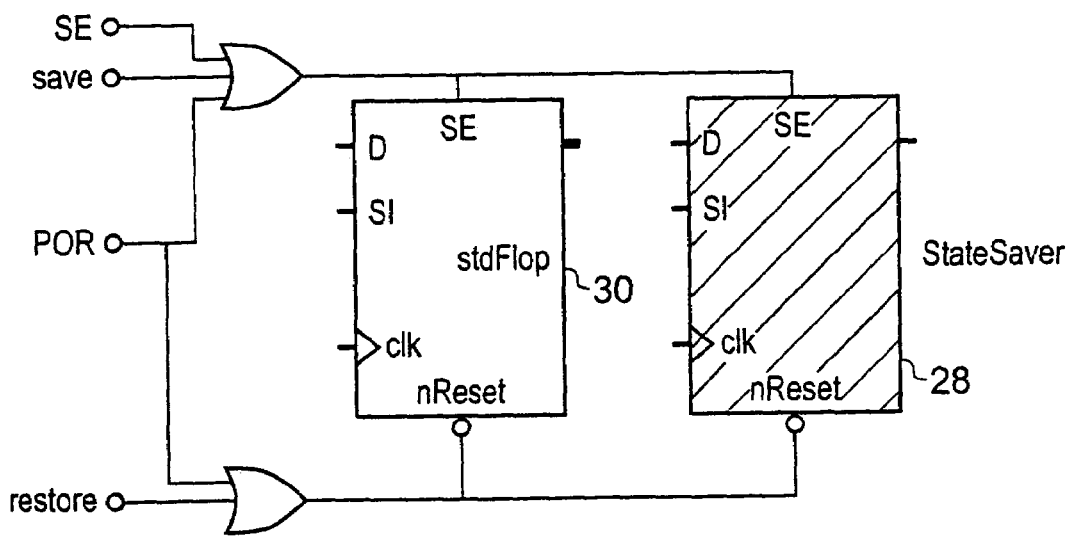
FIG. 5 is a table illustrating the combinations of the reset signal and the scan enable signal for controlling the operation of the latch circuit of FIGS. 1 to 4.
FIG. 6 schematically illustrates an apparatus which may include a plurality of latch circuits incorporating a data retention latch and a plurality of standard latch circuits all controlled by the same reset and scan enable signals.

FIG. 5 is a table illustrating the various states of the reset signal nreset and scan enable signal SE and the functions they perform. One additional state shown in the table is the normal mode of operation of the latch circuit 2 in which the reset signal nreset is held high and the scan enable signal SE is held low. In this mode of operation the functional path latch serves to capture and pass between its respective master and slave stages 4, 6 the normal operational data values in accordance with its clock control signals bclk, nclk and its normal flip-flop operation.

FIG. 6 schematically illustrates how an integrated circuit may be formed with a plurality of latch circuits 28 including the data retention latch 12, 14 as previously discussed as well as a plurality of latch circuits 30 which do not include such a data retention latch. These two sets of latches 28, 30 can both be driven by the same reset signal nreset and scan enable signals SE. The latches 28 including the data retention latches 12, 14 will exhibit the save and restore functions previously described as well as the normal scan and reset functions. The latches 30, which do not have the data retention latch 12, 14, exhibit their normal behaviour and respond to the reset and scan enable signals to perform the normal reset and scan operations only. Also illustrated in FIG. 6 is the manner in which the reset signals may be generated from inputs commanding respectively a restore operation, a power on reset operation (POR), a save operation and a scan operation (SE).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A latch circuit having a data signal input, a scan signal input, a clock signal input, a reset signal input, a scan enable signal input and a data signal output, said latch circuit comprising:

a functional path latch having an active mode in which said functional path latch is operable in response to a clock signal received at said clock signal input to store a data signal value received at said data signal input and to output said data signal value at said data signal output and an inactive mode in which said functional path latch is not able to store said data signal value; and a data retention latch for saving said data signal value from said functional path latch when said functional path latch enters said inactive mode and for restoring said data signal value to said functional path latch when said functional path latch enters said active mode; wherein a reset signal received at said reset signal input and a scan enable signal received at said scan enable signal input, for controlling said functional path latch and said data retention latch:

(i) to reset at least said functional path latch;
(ii) to restore a data signal value stored in said data retention latch to said functional path latch;
(iii) to select a scan signal input value received at said scan signal input for storage in at least one of said functional path latch and said data retention latch; and
(iv) to save a data signal value from said functional path latch to said data retention latch.

2. A latch circuit as claimed in claim 1, wherein said functional path latch is within a first power supply domain and said data retention latch is within a second power supply domain.

3. A latch circuit as claimed in claim 2, wherein when said functional path latch is in said inactive mode, said first power supply domain does not supply electrical power to said function path latch while said second power supply domain continues to supply power to said data retention latch.

4. A latch circuit as claimed in claim 3, wherein said functional path latch comprises one or more gates having a first threshold voltage and said data retention latch comprises one or more gates having a second threshold voltage, said first threshold voltage having a level providing faster switching and higher static leakage current than said second threshold voltage.

5. A latch circuit as claimed in claim 1, having a scan signal output separate from said data signal output, said scan signal output being driven from said data retention latch via a scan signal output buffer circuit.

6. A latch circuit as claimed in claim 1, wherein a data signal value stored in said data retention latch may be restored multiple times to said functional path latch.

7. A latch circuit as claimed in claim 1, wherein said functional path latch is a flip-flop latch.

8. A data processing apparatus having one or more latch circuits including a data retention latch as claimed in claim 1 and latch circuits not including a data retention latch, said one or more latch circuits including a data retention latch and said latch circuits not including a data retention latch share said reset signal wherein a change in said reset signal performed as part of controlling said one or more latch circuits including a data retention latch and restoring a data signal value stored in said data retention latch to said functional path latch serves to reset said one or more latches not including a data retention latch.

9. An integrated circuit including at least one latch circuit as claimed in claim 1.

10. A latch circuit having a data signal input, a scan signal input, a clock signal input, a reset signal input, a scan enable signal input and a data signal output, said latch circuit comprising:

functional path latch means for, in an active mode, in response to a clock signal received at said clock signal input, storing a data signal value received at said data signal input and outputting said data signal value at said data signal output and, in an inactive mode, not storing said data signal value; and a data retention latch means for saving said data signal value from said functional path latch means when said functional path latch means enters said inactive mode and restoring said data signal value to said functional path latch means when said functional path latch means enters said active mode; wherein a reset signal received at said reset signal input and a scan enable signal received at said scan enable signal input control said functional path latch means and said data retention latch means:

(i) to reset at least said functional path latch means;
(ii) to restore a data signal value stored in said data retention latch means to said functional path latch means;
(iii) to select a scan signal input value received at said scan signal input for storage in at least one of said functional path latch means and said data retention latch means; and
(iv) to save a data signal value from said functional path latch means to said data retention latch means.

11. A method of controlling a latch circuit having a data signal input, a scan signal input, a clock signal input, a reset signal input, a scan enable signal input and a data signal output, said latch circuit comprising:

a functional path latch having an active mode in which said functional path latch is operable in response to a clock signal received at said clock signal input to store a data signal value received at said data signal input and to output said data signal value at said data signal output and an inactive mode in which said functional path latch is not able to store said data signal value; and a data retention latch for saving said data signal value from said functional path latch when said functional path latch enters said inactive mode and for restoring said data signal value to said functional path latch when said functional path logic enters said active mode; said method comprising:

controlling, in response to a reset signal received at said reset signal input and a scan enable signal received at said scan enable signal input, said functional path latch and said data retention latch:

(i) resetting at least said functional path latch;
(ii) restoring a data signal value stored in said data retention latch to said functional path latch;
(iii) selecting a scan signal input value received at said scan signal input for storage in at least one of said functional path latch and said data retention latch; and
(iv) saving a data signal value from said functional path latch to said data retention latch.

* * * * *